US007642771B2

(12) United States Patent
Lin

(10) Patent No.: US 7,642,771 B2
(45) Date of Patent: Jan. 5, 2010

(54) PIN FIXTURE FOR GLUE DISPENSER

(75) Inventor: Tung-Jung Lin, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 333 days.

(21) Appl. No.: 11/737,943

(22) Filed: Apr. 20, 2007

(65) Prior Publication Data

US 2008/0007283 A1 Jan. 10, 2008

(30) Foreign Application Priority Data

Jul. 7, 2006 (CN) ........................ 2006 1 0061567

(51) Int. Cl.
*G01R 31/28* (2006.01)

(52) U.S. Cl. .................................... 324/158.1; 220/630

(58) Field of Classification Search ............. 324/158.1, 324/761

See application file for complete search history.

(56) References Cited

U.S. PATENT DOCUMENTS

| | | | | |
|---|---|---|---|---|
| 4,938,383 | A * | 7/1990 | Yamazaki et al. | 222/41 |
| 5,423,889 | A * | 6/1995 | Colquitt et al. | 29/25.01 |
| 5,916,414 | A * | 6/1999 | Kato et al. | 156/578 |
| 6,582,993 | B1 * | 6/2003 | Baba et al. | 438/118 |
| 2003/0015553 | A1 * | 1/2003 | Savaria | 222/160 |
| 2007/0006805 | A1 * | 1/2007 | Cruz et al. | 118/300 |
| 2009/0108033 | A1 * | 4/2009 | Quinn et al. | 222/568 |

* cited by examiner

*Primary Examiner*—Ha Tran T Nguyen
*Assistant Examiner*—Richard Isla Rodas
(74) *Attorney, Agent, or Firm*—Steven M. Reiss

(57) ABSTRACT

A glue/adhesive delivery pin fixture (100) includes a top board (10), a support board (30), a bottom/output board (40), and a plurality of pins (50). The top board defines a gate (i.e., conduit) (14) and a plurality of glue runners (16) extending from one end of the gate. The support board has a plurality of through holes (36) defined therein. Each through hole communicates with a corresponding glue runner. The bottom board has a plurality of receiving holes (48), respectively corresponding to the through holes. A given pin is received in a respective through hole and includes a holding portion (52) on one end thereof. One side of the holding portion resists the support board, and the other side resists the bottom board. Each pin communicates with a corresponding through hole in the support board.

17 Claims, 7 Drawing Sheets

PIN FIXTURE FOR GLUE DISPENSER

BACKGROUND OF THE INVENTION

1. Field of the Invention

The present invention relates to pin fixtures and, particularly, to a pin fixture used in a glue dispenser.

2. Description of Related Art

Keypads used in electronic devices, such as mobile phones and PDAs, generally include a rubber pad and a plurality of plastic keys/capkeys/buttons. The keys/buttons are mounted on the rubber pad by means of a glue/adhesive. A glue dispenser is used to drop/deposit glue onto the rubber pad. The dispenser generally includes a pin fixture and a glue container. The pin fixture generally includes a main body and a plurality of pins integrally formed with the main body. Each pin defines a narrow channel/conduit for guiding/conveying a flow of glue. In use, an amount of glue is pressed into the pin fixture from the glue container of the dispenser. The glue then flows along/through the channels of the pins and is finally dropped/deposited on the rubber pad.

However, when the glue dispenser stops working, some glue may remain in the channels of the pins. Since the channels are narrow, the channels can easily become blocked when glue remaining therein is able to solidify. Accordingly, when an attempt to use the glue dispenser again is made, the glue cannot pass through a given pin whose channel is blocked by solidified glue. As such, a blocked pin would likely need to be replaced, as removal of the solidified glue may not be possible or at least not cost/time effective to achieve. Since the pins of the conventional glue dispenser are integrally formed with the main body, the whole pin fixture has to be replaced in such an instance.

Therefore, a new pin fixture is desired in order to overcome the above-described problems.

SUMMARY OF THE INVENTION

In one embodiment thereof, a pin fixture includes a top board, a support board, a bottom board, and a plurality of pins. The top board defines a gate and a plurality of glue/adhesive runners extending from one end of the gate. The support board has a plurality of through holes defined therein. Each through hole communicates with a corresponding glue runner. The bottom board has defined therein a plurality of receiving holes corresponding to the through holes. The pin is received in the through hole and includes a holding portion on/at one end thereof. One side of the holding portion resists (i.e., biases against) the support board and the other side resists the bottom board. Each pin communicates with a corresponding through hole.

Other advantages and novel features will become more apparent from the following detailed description when taken in conjunction with the accompanying drawings.

BRIEF DESCRIPTION OF THE DRAWINGS

Many aspects of the pin fixture can be better understood with reference to the following drawings. The components in the drawings are not necessarily drawn to scale, the emphasis instead being placed upon clearly illustrating the principles of the present pin fixture. Moreover, in the drawings, like reference numerals designate corresponding parts throughout the several views.

DETAILED DESCRIPTION OF THE INVENTION

Figure 1:
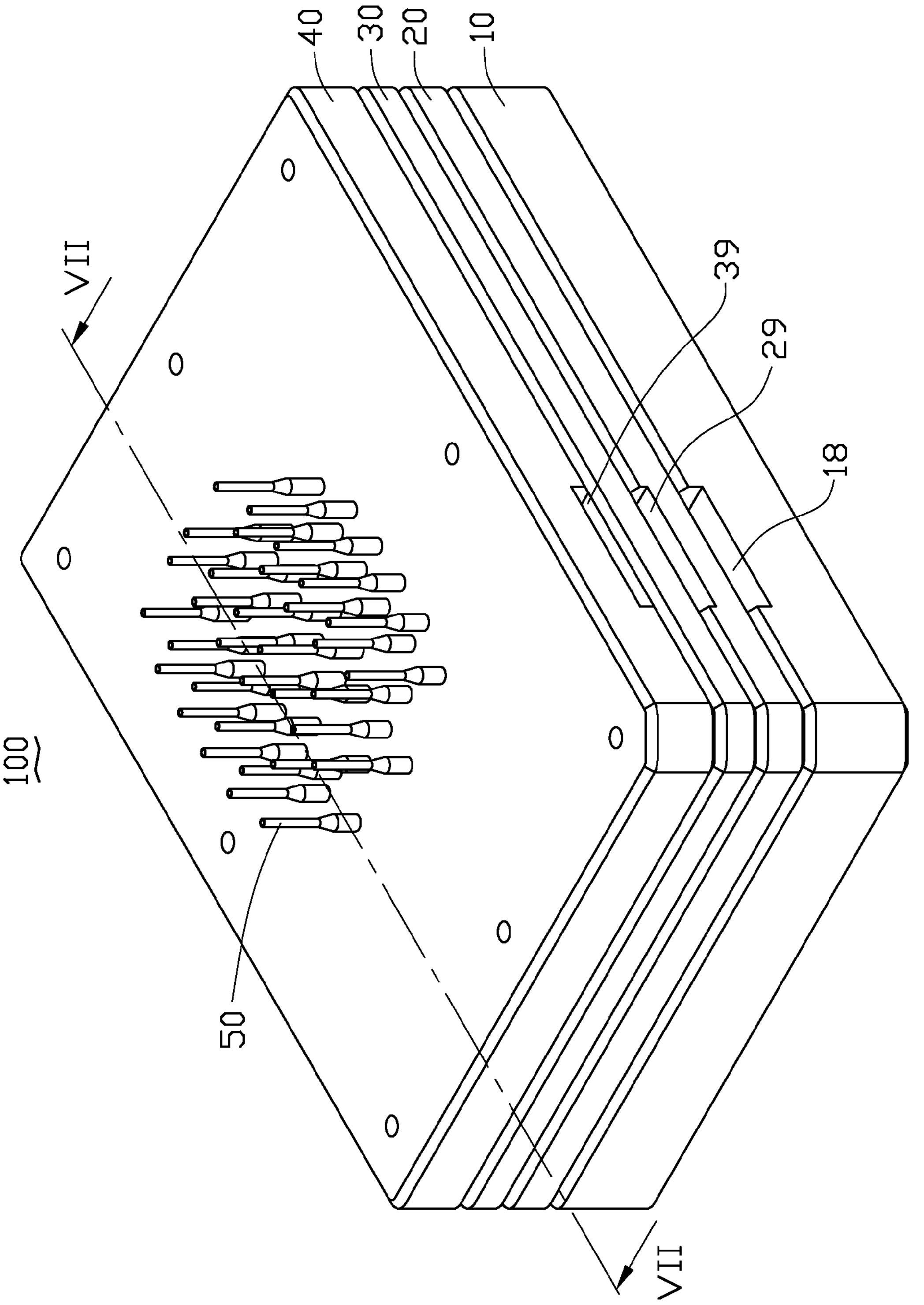
FIG. 1 is an assembled, isometric view of a pin fixture, in accordance with a preferred embodiment.

Referring now to FIG. 1, the pin fixture 100 configured for localized glue/adhesive delivery includes a top board 10, a middle board 20, a support board 30, a bottom/output board 40, and a plurality of pins 50, in accordance with the present embodiment. All of the top board 10, the middle board 20, the support board 30, and the bottom board 40 are approximately rectangular in shape.

Figure 2:
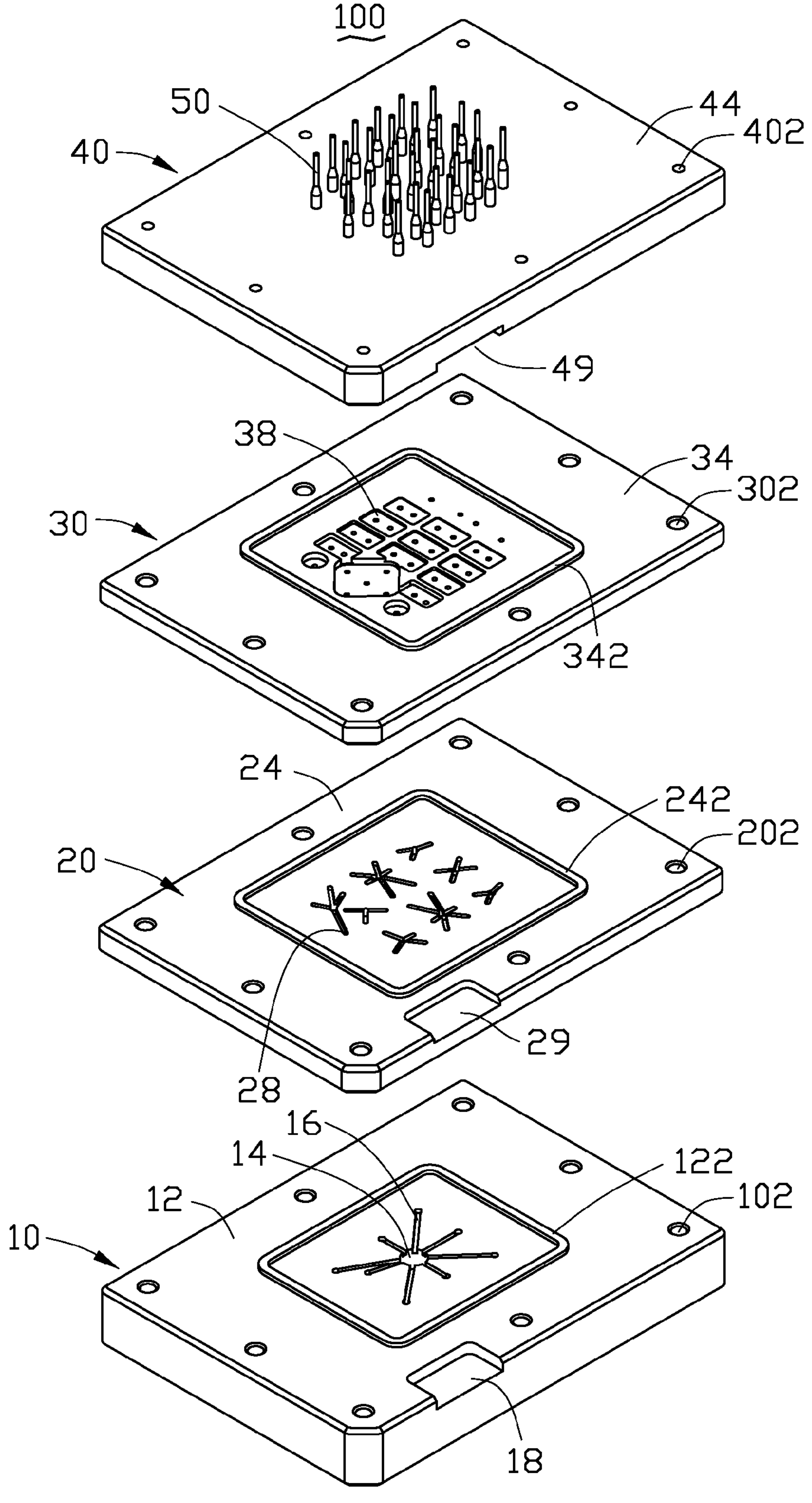
FIG. 2 is an exploded view of the pin fixture shown in FIG. 1.
Figure 3:
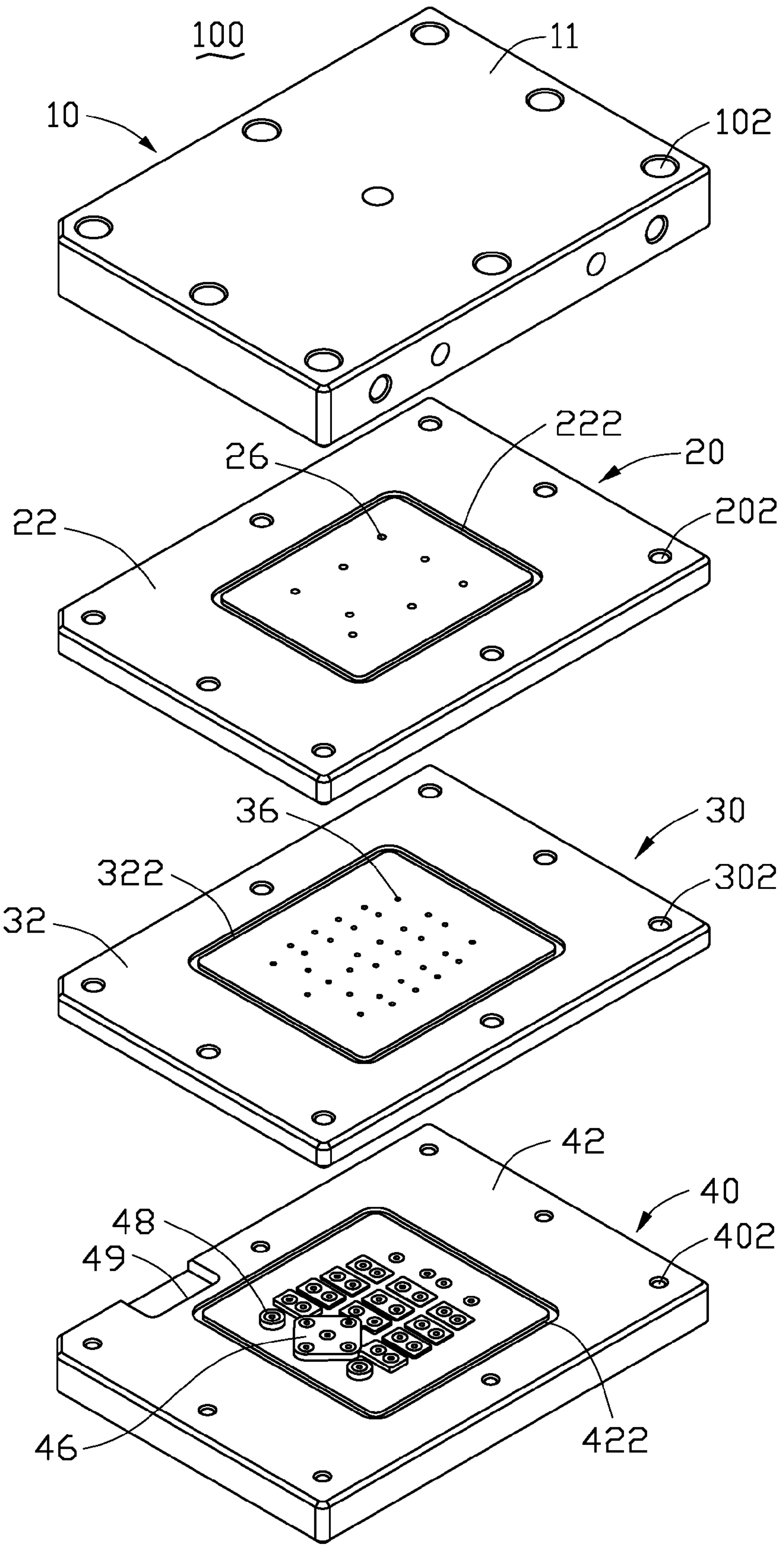
FIG. 3 is similar to FIG. 2, but showing another aspect.
Figure 4:
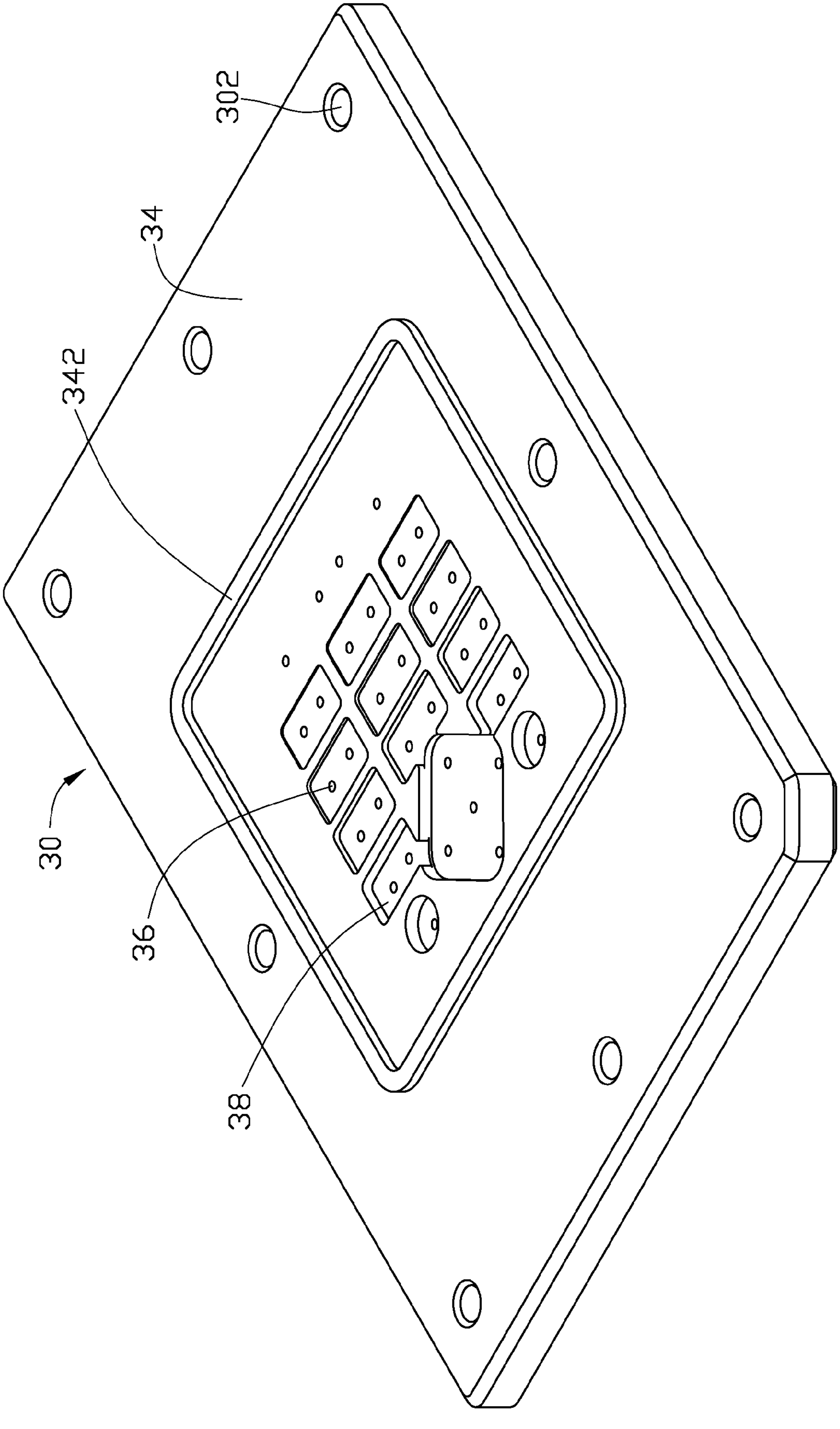
FIG. 4 is an isometric view of a support board shown in FIG. 2.

Referring to FIGS. 2 and 3, the top board 10 includes a top surface 111 and an opposite bottom surface 12. The top board 10 has a gate (i.e., glue-receiving opening) 14 defined in and through a central area thereof. The gate 14 fully extends from the top surface 11 to the bottom surface 12 acts as a fluid conduit so as to allow glue from an outside source to flow into the pin fixture 100. A plurality of radial glue runners 16 are formed on/in the bottom surface 12, with one end of each glue runner 16 fluidly communicating with the gate 14. Each glue runner 16 extends to a designed point, and the lengths of the glue runners, advantageously, are different to allow the glue/adhesive (not shown) to be directed to various locations within the pin fixture 100. The depth of the glue runner 16 is in direct ratio to the length of the glue runner 16. The glue runner 16 becomes deeper as the glue runner becomes longer (i.e., longer ones beneficially have a greater constant depth than shorter ones), so that the glue may reach each of the ends of the glue runners at the same time. A first flange 122 protrudes integrally from the bottom surface 12 of the top board 10. The first flange 122 forms an essentially rectangular loop (with just the corners being rounded to avoid having stress concentration thereat) centered on/around the gate 14 and surrounds the glue runners 16. The rectangular shape is important in preventing relative rotational and/or linear movement between the top board 10 and the middle board 20, upon mating thereof, and thus ensuring that the glue/adhesive will be properly directed by the glue runners 16.

The middle board 20 has an upper surface 22 and an opposite lower surface 24. A plurality of passages 26 is defined in the middle board 20, extending fully therethrough, from the upper surface 22 to the lower surface 24. The positions of the passage 26 correspond to those of the glue runners 16 to facilitate fluid flow from one to the other. A first slot 222 is defined in the upper surface 22 and is approximately rectangular to match the first flange 122 of the top board. The first slot 222 is configured (i.e., structured and arranged) for fittingly engaging with the first flange 122 of the top board 10, usefully engaging in a manner that restricts rotational and/or linear movement therebetween. Overflow of the glue is avoided by means of the engagement of the first flange 122 and the first slot 222. A plurality of glue channels 28 is defined in the lower surface 24 of the middle board 20. Each passage 26, usefully, communicates with several glue channels 28 to help ensure an adequate glue/adhesive flow to a given passage 26. A second flange 242 protrudes from the lower surface 24 and surrounds the glue channels 28. The second flange 242, beneficially, is essentially rectangular, to ensure the desired glue channel positioning in assembly. It is to be understood that other mating combinations of essentially rectangular, mating flange/slot combinations are employed, also with the goal of maintaining a desired rotational/linear alignment between adjoining parts.

The support board 30 has a first surface 32 and an opposite second surface 34. A plurality of through holes 36 is defined in the support board 30. The position of the through holes 36 fluidly corresponds to that of the glue channels 28. A second slot 322 is defined in the first surface 32, the second slot 322 being configured for receiving the second flange 242 of the middle board 20. A plurality of grooves 38 is defined in the second surface 34 of the support board 30. Each groove 38 fluidly communicates with at least one through hole 36. The depths of the grooves 38 may be different and can be altered according to the surface of the workpiece. The corresponding groove 38 becomes deeper at the point where the amount of glue dropped/deposited becomes greater. A third flange 342 protrudes integrally from the second surface 34 of the support board 30.

Figure 5:
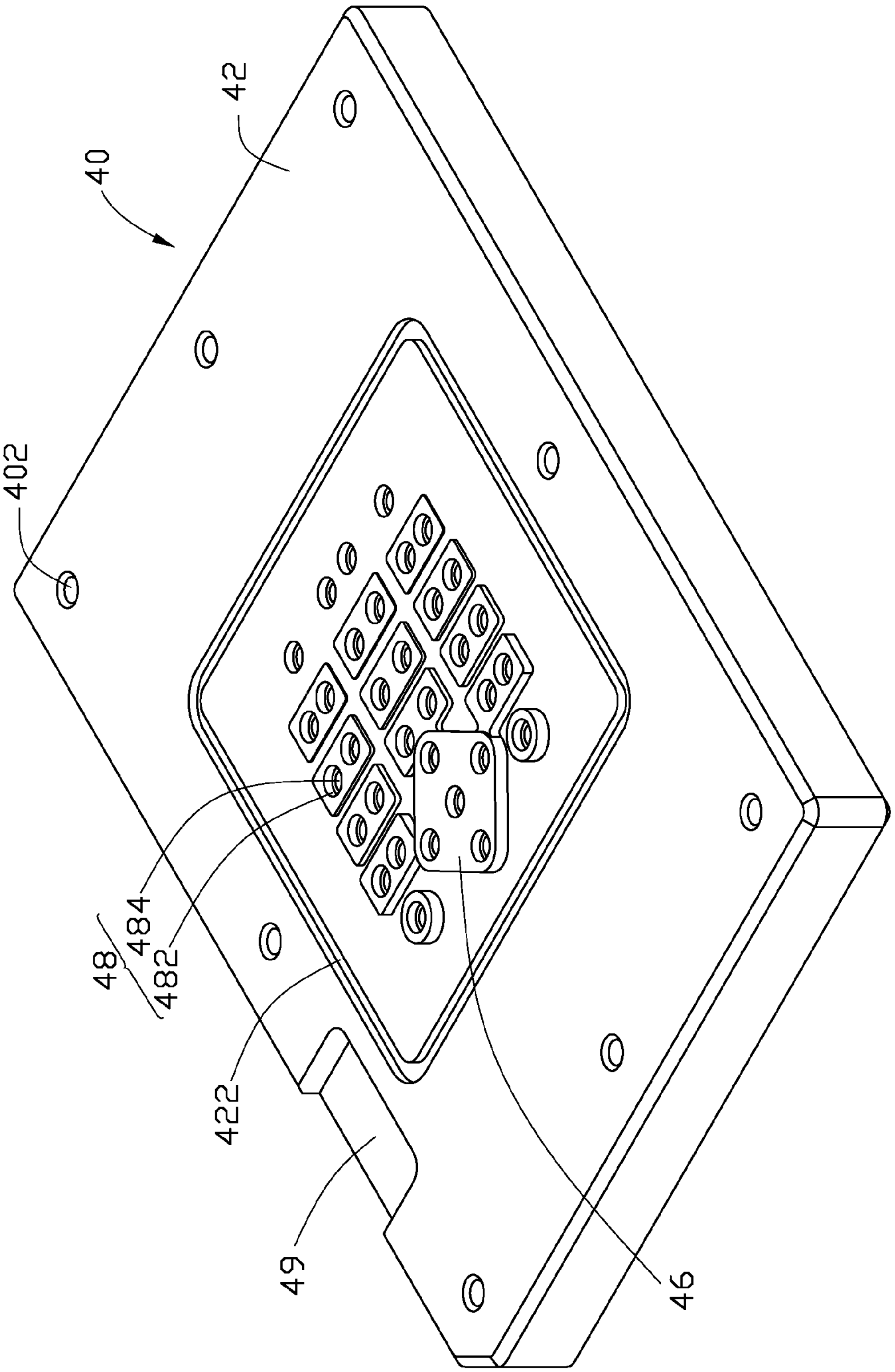
FIG. 5 is an isometric view of a support board shown in FIG. 3.
Figure 6:
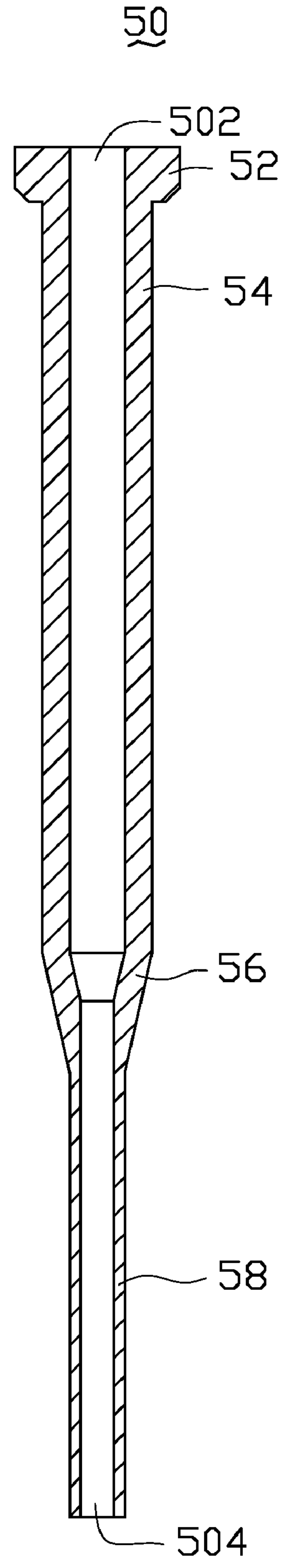
FIG. 6 is a cut-away view of a pin shown in FIG. 1.

Also referring to FIG. 5, the bottom board 40 includes a front surface 42 and an opposite back surface 44. A plurality of protruding blocks 46 is formed on the front surface 42. The number of the protruding blocks 46 is the same as that of the grooves 38 of the support board 30. Each protruding block 46 is configured for engaging in a corresponding groove 38 of the support board 30. A plurality of receiving holes 48 is defined in the bottom board 40. The position of the receiving holes 48 fluidly corresponds, respectively, to that of the through holes 36 of the support board 30. The receiving hole 48 extends through the bottom board 40 and includes a holding hole 482 and a central hole 484. The central hole 482 extends through the back surface 44 of the bottom board 40. The diameter of the central hole 484 is smaller than that of the holding hole 482. A third slot 422, approximately rectangular in nature to mate with a corresponding flange, is formed in the front surface 42 of the bottom board 40 and surrounds the protruding blocks 46.

The top board 10, the middle board 20, the support board 30, and the bottom board 40 may, advantageously, be made of a metal alloy, such as aluminum alloy or the like to facilitate easy machining thereof and to yield a durable, corrosion-resistant apparatus 100.

The pins 50 may, advantageously, be made of a corrosion-resistant metal, such as stainless steel, copper alloy, or the like. Each pin 50 is a hollow fluid conduit and has an input opening 502 and an output opening 504. The pin 50 includes a holding portion 52, an extended cylindrical portion 54, a tapered portion 56, and a smaller cylindrical portion 58, which are connected end-to-end to each other, in that order, being advantageously integrally co-formed in such a manner. The respective diameter of the holding portion 52, the extended cylindrical portion 54, the tapered portion 56, and the smaller cylindrical portion 58 are reduced, in order (i.e., in order of widest diameter to narrowest). The extended cylindrical portion 54 of the pin 50 is configured for fittingly/matingly engaging with the holding hole 482 of the bottom board 40. The smaller cylindrical portion 58 is configured for fittingly engaging in the central hole 484 of the bottom board 40.

The top board 10, the middle board 20, the support board 30, and the bottom board 40, respectively, define fixing holes 102, 202, 302, 402 on the edges thereof so as to allow them to be connected together by, e.g., screws and/or bolts. The top board 10, the middle board 20, and the bottom board 40, respectively, define openings 18, 29, 49 on the bottom surface 12, the lower surface 24, and the front surface 42 so that the assembled pin fixture 100 may be easily separated using a tool.

Figure 7:
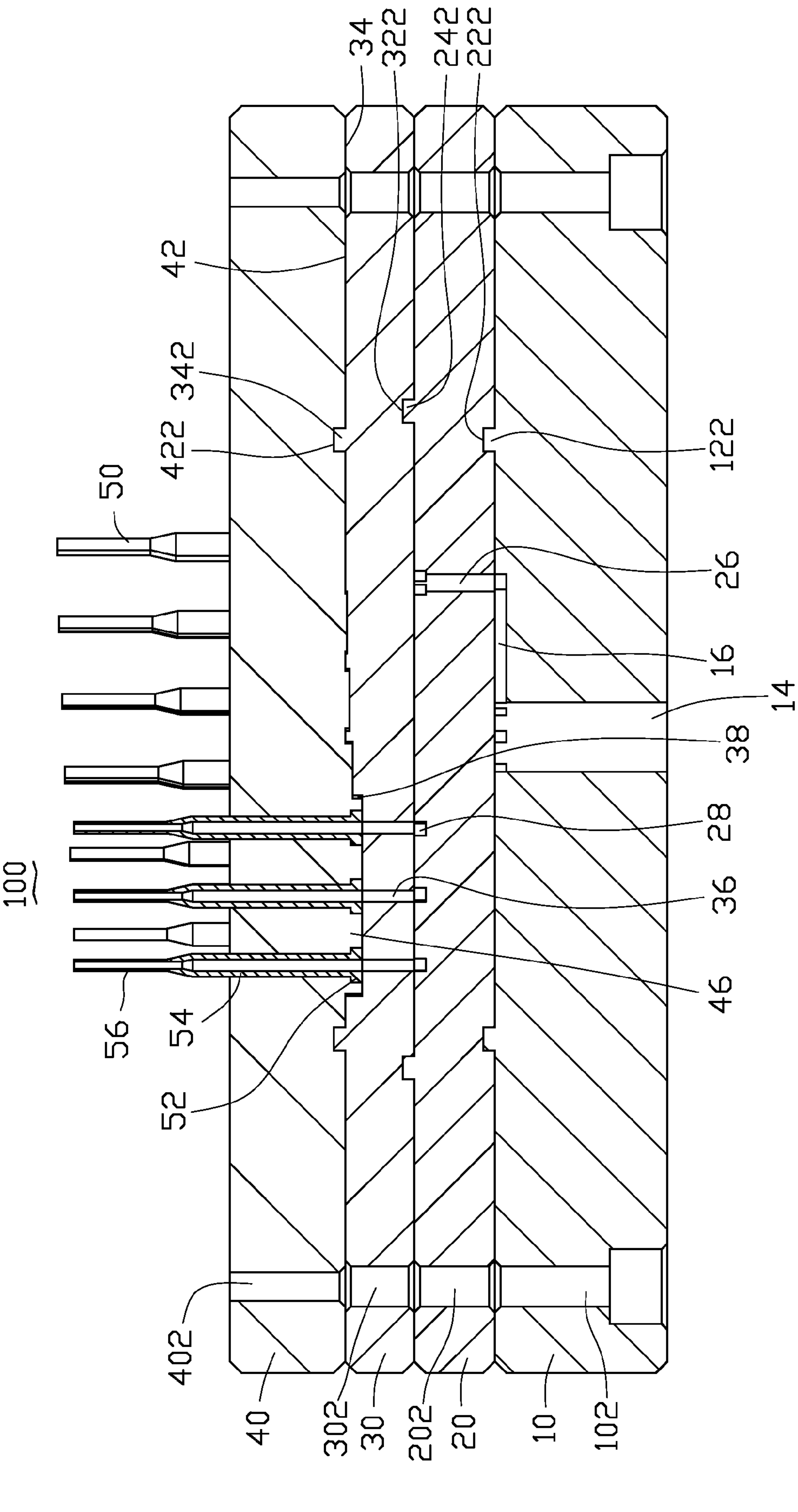
FIG. 7 is a cut-away view of the pin fixture taken along the VII-VII line.

Referring to FIGS. 7 and 8, in assembly of the pin fixture 100, firstly, the pins 50 are respectively inserted into the receiving holes 48 from the front surface 42 of the bottom board 40. The smaller cylindrical portion 58 of the pin 50 extends out of the back surface 44 of the bottom board 40. The wider-diameter holding portion 52 of the pin 50 is received in the holding hole 482, and the extended (i.e., extended in length) cylindrical portion 54 is received in the central hole 484. The wider-diameter holding portion 52 prevents the pin 50 from becoming dislodged from the pin fixture 100, once assembled.

Secondly, the third flange 342 of the support board 30 is positioned corresponding to the third slot 422 of the bottom board 40, and the groove 38 is positioned corresponding to the protruding block 46. Then, the support board 30 is pushed toward the bottom board 40. The third flange 342 of the support board 30 becomes fittingly engaged in the mating third slot 422 of the bottom board 40. The protruding blocks 46 of the bottom board 40 are respectively received in a corresponding groove 38. One side of the holding portion 52 resists (i.e., biases against) the support board 30, and the other side resists the bottom board 40 so that the pin 50 is locked in the receiving hole 48. The pin communicates with a corresponding through hole, being fittingly received therein.

Thirdly, the second flange 242 of the middle board 20 is fittingly engaged in the second slot 322 of the support board 30, the flange/slot combination again being basically rectangular to prevent relative rotational and/or linear between the middle board 20 and the support board 30, thereby maintaining the desired fluid channel matching. The through holes 36 each fluidly communicate with their corresponding glue channels 28.

The first flange 122 of the top board 10 is then fittingly engaged in the first slot 222 of the middle board 20. Each passage 26 fluidly communicates with a corresponding glue runner 16.

Finally, the top board 10, the middle board 20, the support board 30, and the bottom board 40 are attached by, e.g., screws and/or bolts, so that the assembly of the pin fixture 100 is finished.

In use, the pin fixture 100 is attached to a glue/adhesive dispenser (not shown) and is used to distribute a glue/adhesive to a plurality of chosen positions/locations, so that the glue may effectively drop/deposit on/at certain predetermined points/positions of a workpiece, e.g., a rubber pad of a keypad. The pin fixture 100 communicates with a glue container of the glue dispenser by means of a tube or other fluid conduit (not shown). A valve is, usefully, set/provided in the tube so as to control the speed (i.e., flow rate) of the glue. When the valve is open, an amount of glue from the glue container is provided (advantageously, pressed, to increase flow rate) into the pin fixture. Opening of the valve allows glue from the glue container to be delivered/pushed into the gate 14 of the top board 10. The glue then passes through the glue runners 16, the passages 26, the glue channels 28, the through holes 36, and the pins 50, in that order, due to such elements being properly aligned relative to one another to facilitate fluid communication therebetween. The glue flows out from the output opening 504 of the pin 50 and is dropped/deposited on the surface of the workpiece. When the valve is closed, the flow of glue ultimately stops.

It should be understood that the pins 50 may be separated from the bottom board 40 so that a given malfunctioning pin 50 can easily be individually replaced and/or cleaned, to remove the blockage, when it is, for example, blocked by solidified glue. Also, such easy disassembly would make cleaning glue solidified in any of the various fluid flow paths, even other than the pins 50, easier to achieve potentially, allowing the pin fixture 100 to, periodically, be effectively cleaned.

It also should be understood that the grooves 38 of the support board 30 and the protruding blocks 46 of the bottom board 40 are shaped according to the surface of the workpiece, so that the pins 50 may be of a similar size. Therefore, the pins 50 may be manufactured using a single mold so as to reduce the cost thereof.

In an alternative embodiment, the holding holes 482 of the bottom board 40 can be omitted, and the support board 30 may have several holding holes 482 defined in the bottom surface 12 of the grooves 38, accordingly.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A pin fixture, comprising:
- a top board having a gate defined therethrough, the top board further having a plurality of glue runners formed therein, the glue runners extending from one end of the gate;
- a support board having a plurality of through holes defined therein, each through hole communicating with a corresponding glue runner;
- a bottom board having a plurality of receiving holes defined therein, each receiving hole corresponding to a through hole of the support board; and
- a plurality of pins respectively received in the receiving holes, each pin including a holding portion at one end thereof, one side of the holding portion resisting the support board and the other side resisting the bottom board, with each pin fluidly communicating with a corresponding through hole, wherein glue passes through the gate, the glue runners, the through holes and the pins.

2. The pin fixture as claimed in claim 1, further comprising a middle board, wherein the middle board has a plurality of passages defined therethrough, each passage communicates with a corresponding glue runner, a plurality of glue channels are defined in the middle board, each passage communicates with at least one glue channel, and each glue channel communicates with a corresponding through hole of the support board.

3. The pin fixture as claimed in claim 2, wherein the support board defines at least one groove, the at least one groove respectively communicates with at least one corresponding through hole, a protruding block is formed on the bottom board, at least one receiving hole extends out from the protruding block, and the protruding block is engaged with the groove.

4. The pin fixture as claimed in claim 3, wherein a plurality of holding holes are defined in the support board, each holding hole corresponds to its respective through hole, and the flange of the pin is received in the holding hole.

5. The pin fixture as claimed in claim 3, wherein a plurality of grooves are defined in the support board, the depth of each of the grooves is different, and, accordingly, a plurality of protruding blocks are formed on the bottom board and are configured for engaging with the grooves.

6. The pin fixture as claimed in claim 5, wherein the top board has a first flange formed thereon, the first flange surrounds the glue runners, a first slot is defined in one side of the middle board, and the first slot fittingly engages with the first flange of the top board.

7. The pin fixture as claimed in claim 6, wherein the middle board has a second flange on another side thereof, the second flange surrounds the glue channels, the support board defines a second slot on one side thereof, and the second slot fittingly engages with the second flange.

8. The pin fixture as claimed in claim 7, wherein the support board has a third flange on another side thereof, the third flange surrounds the at least one groove, the bottom board defines a third slot engaged with the third flange.

9. The pin fixture as claimed in claim 2, wherein the receiving hole includes a holding hole and a central hole, the flange of the pin is received in the holding hole, and the other end of the pin extends out of the central hole.

10. The pin fixture as claimed in claim 9, wherein the pin further comprises an extended cylindrical portion, a tapered portion, and a smaller cylindrical portion, the tapered portion connects the extended cylindrical portion with the smaller cylindrical portion, and the smaller cylindrical portion extends out of the central hole.

11. The pin fixture as claimed in claim 2, wherein each of the top board, the middle board, and the bottom board respectively has at least one opening defined in an edge thereof.

12. A pin fixture, comprising:
- a top board having a gate defined therein, the top board further having a plurality of glue runners formed therein, the glue runners extending from one end of the gate;
- a support board having a plurality of through holes defined therein, each through hole communicating with a corresponding glue runner;
- a bottom board having a plurality of receiving holes extending therethrough, each receiving hole corresponding to a through hole of the support board; and
- a plurality of pins respectively locked in the receiving holes by means of the engagement of the support board and the bottom board, each pin communicating with a corresponding through hole, wherein glue passes through the gate, the glue runners, the through holes and the pins.

13. The pin fixture as claimed in claim 12, further comprising a middle board, wherein the middle board has a plurality of passages defined therethrough, each passage communicates with a corresponding glue runner, a plurality of glue channels are defined in the middle board, each passage communicates with at least one glue channel, and each glue channel communicates with a corresponding through hole of the support board.

14. The pin fixture as claimed in claim 12, wherein the support board defines at least one groove, the at least one groove respectively communicates with at least one corresponding through hole, a protruding block is formed on the bottom board, at least one receiving hole extends out from the protruding block, and the protruding block is engaged in the groove.

15. The pin fixture as claimed in claim 12, wherein the receiving hole includes a holding hole, the pin comprises a holding portion on one end thereof, and the holding portion of the pin is received in the holding hole.

16. The pin fixture as claimed in claim 15, wherein the receiving hole further comprises a central hole, the pin further comprises an extended cylindrical portion, a tapered portion, and a smaller cylindrical portion, the tapered portion connects the extended cylindrical portion with the smaller cylindrical portion, and the smaller cylindrical portion extends out from the central hole.

17. The pin fixture as claimed in claim 12, wherein a plurality of holding holes are defined in the support board, each holding hole corresponds to its respective through hole, the pin comprises a holding portion on one end thereof, and the holding portion of the pin is received in the holding hole.

* * * * *